United States Patent
Antoni

(10) Patent No.: US 6,535,274 B2
(45) Date of Patent: Mar. 18, 2003

(54) PROJECTION EXPOSURE DEVICE

(75) Inventor: Martin Antoni, Aalen (DE)

(73) Assignee: Carl Zeiss-Stiftung (DE)

(*) Notice: Subject to any disclaimer, the term of this patent is extended or adjusted under 35 U.S.C. 154(b) by 0 days.

(21) Appl. No.: 09/945,363

(22) Filed: Aug. 31, 2001

(65) Prior Publication Data
US 2002/0075468 A1 Jun. 20, 2002

(30) Foreign Application Priority Data
Sep. 2, 2000 (DE) .......................... 100 43 315

(51) Int. Cl.⁷ .................. G03B 27/54; G03B 27/42; G03B 27/72; A61N 5/00; G03F 9/00
(52) U.S. Cl. .................. 355/67; 355/53; 355/55; 355/71; 250/492.2; 250/492.22; 430/5
(58) Field of Search .............. 355/53, 55, 67, 355/71; 250/492.2, 492.22; 430/5

(56) References Cited

U.S. PATENT DOCUMENTS

| | | | |
|---|---|---|---|
| 5,264,898 A | 11/1993 | Kamon et al. | 355/71 |
| 5,627,626 A * | 5/1997 | Inoue et al. | |
| 5,707,501 A * | 1/1998 | Inoue et al. | |
| 5,712,698 A | 1/1998 | Poschenrieder et al. | 355/67 |

FOREIGN PATENT DOCUMENTS

| | | |
|---|---|---|
| DE | 44 30 253 A1 | 3/1995 |
| EP | 0 969 327 A2 | 1/2000 |

* cited by examiner

Primary Examiner—Russell Adams
Assistant Examiner—Khaled Brown
(74) Attorney, Agent, or Firm—Factor & Partners

(57) ABSTRACT

A projection exposure device, in particular for microlithography, serves to produce an image of an object in an image plane positioned in an object plane. This happens with the aid of a light source emitting projection light and illumination optics positioned in the ray path between the light source and the object plane. In addition projection optics positioned in the ray path between the object plane and the image plane serve to guide the projection light. A filter (7) is positioned in a filter plane which lies in the vicinity of a pupil plane between the light source and the object plane. This has a moveable filter element (22') which has at least in certain areas (24) for the projection light a transmission factor which is greater than zero and less than 100%. The moveable filter element (22') is moveable in the filter plane and has a distribution of the transmission factor over the filter face, in such a way that the intensity distribution of the projection light perpendicular to the optical axis (14) in the ray path after the filter (7) changes with the movement of the filter element (22'). With such a filter (7) an illumination angle distribution can be adapted to a pre-set value (FIG. 5).

18 Claims, 4 Drawing Sheets

PROJECTION EXPOSURE DEVICE

FIELD OF THE INVENTION

The invention relates to a projection exposure device, in particular for micro-lithography, to produce an image of an object in an image plane positioned in an object plane with a radiation source emitting projection radiation, with illumination optics positioned in the ray path between the light source and the object plane and projection optics positioned in the ray path between the object plane and the image plane, whereby a filter with a moveable filter element is placed in a filter plane, which lies in the vicinity of a pupil plane between the light source and the object plane, which is moveable in the filter plane and has a distribution of the transmission factor over the filter face in such a way that the intensity distribution of the projection light perpendicular to the optical axis in the ray path after the filter, changes with the movement of the filter element.

BACKGROUND TO THE INVENTION

Such a projection exposure device is known from U.S. Pat. No. 5,264,898. The filter used there has filter elements which completely block the projection light in certain areas and allow it to pass through in other areas. The filter is intended to be used to optimise the focal length of the illumination optics in the object plane while preserving the resolution of the projection exposure device.

Especially in projection operations, where three dimensional structures are projected, thus for example when transferring three dimensional structures from a recticle to a wafer in connection with micro-lithography, it has been shown that it is a matter not only of homogeneous as possible illumination of the object plane but also of well-defined distribution of the illumination angle in the object plane, i.e the angles under which the projection radiation strikes the object plane. The illumination angle distribution to be set depends on how the structures are positioned on the recticle and what extension they have perpendicular to the object plane. For different recticle structures therefore different illumination angle distributions may have to be preset for optimum projection.

If the filter in U.S. Pat. No. 5,264,898 (which has a completely different purpose, as explained above), were to be used for the defined presetting of illumination angles, there would be no possibility in addition of influencing the illumination angle distribution.

SUMMARY OF THE INVENTION

The present invention introduces further developments of a projection exposure device of the type mentioned above to enable a pre-set illumination angle distribution to be set accurately.

Accordinly, the invention provides a projectino exposure device which includes a filter element having a transmission factor, at least in certain areas for the projection light, which is greater than zero and less than 100%.

With a filter having such a filter element in the filter plane with the degree of freedom of movement, for example a translation or rotation of the filter element, and at least in certain areas partial permeability, two degrees of freedom are now available to produce the desired illumination angle distribution in the object plane with the aid of the filter from a given projection light distribution by setting the corresponding transmission in the vicinity of a pupil plane in front of the object plane. A change of the object structure to be projected or alterations in the illumination, which occur during the operation of the projection exposure device, can be compensated by re-adjusting the moveable filter element. Alternatively or in addition with the moveable filter element, illumination settings already preset elsewhere, therefore the illumination angle, for example pre-set by a corresponding aperture shutter, can be finely adjusted.

The transmission factor of the filter element can be non rotation-symmetrical over the filter face in regard to the optical axis of the projection optics and the filter element can be retained in such a way that it can be turned around the optical axis. With a filter, which has such a filter element, by turning the filter element when replacing the recticle the illumination angle distribution can be adapted to the type of recticle used, therefore the object structure to be projected. In addition changes in the illumination can be corrected which finish up in a rotation of a distribution of the illumination intensity in the pupil plane which is non rotation-symmetrical to the optical axis. The filter element rotatable around the optical axis is reset according to the rotation of this intensity distribution so that the intensity distribution after the filter corresponding to a preset distribution which equates to an illumination angle distribution, remains unchanged. Such changes of the illumination intensity distribution in the pupil plane can for example result from time drifts of the properties of the light source or the optical properties of the illumination optics. Also adjustment of the light source or the illumination optics or a change of the illumination setting can cause such a rotation of the illumination intensity distribution.

The filter can have at least one filter element with transmission factor varying in the axial direction to the optical axis. This results in the possibility with the filter to influence areas, with varying distance to the optical axis in a variety of ways. Therefore more complex illumination angle distributions can also be set or reset.

The filter can be a continuously graduated filter. With such filters with at least one filter element with a constantly changing transmission factor, corresponding constant illumination angle distributions can be produced.

Alternatively the filter element can have at least two zones with a varying transmission factor. At the zone borders here it can be a matter of step-shaped progression of the transmission factor. Within the zones the transmission can be constant or again a continuous progression. Such subdivision into zones facilitates defined presetting or defined resetting of an illumination angle distribution.

Preferably the free aperture of the illumination optics in the filter plane is circular and the filter has at least one filter element with multiple zones with a transmission factor varying in the circumferential direction. With such filter elements for example an illumination angle distribution with multiple symmetry can be set.

The filter element can have at least two zones with a transmission factor varying in the radial direction. Also here subdivision into zones facilitates defined presetting or defined resetting of an illumination angle distribution. If subdivision takes place in zones both in the circumferential direction as well as in the radial direction, the freedom when setting an illumination angle distribution is particularly great.

The filter element can have four quadrants with transmission factor alternating in the circumferential direction. With such a filter element an illumination angle distribution which has dual symmetry, i.e. so-called ellipticity, can be adjusted with pre-set orientation of the ellipse. Alternatively or in addition such a filter element can be used to compensate already existing ellipticities. Such ellipticities can for example arise due to the geometry of the light source or the illumination optics or even due to an illumination setting already preset elsewhere.

Preferably the filter has at least two filter elements which are retained in such a way that they can be turned in relation to each other. The distribution of the total transmission factor arising as a result on two filter elements again increases the freedom of presettable or resettable illumination angle distributions.

Here a rotation-symmetrical transmission factor of the filter can result with a relative position of the filter elements. Therefore there is a position of the moveable filter element, in which the filter, at least concerning its influence on the rotation-symmetry, acts neutrally.

In a simple way the rotation-symmetrical properties of the illumination angle distribution can thus be tested or used with no filter influence when the filter is fitted. Especially the filter elements can be designed so that the transmission factor in a relative position of the filter elements is constant over the whole filter face; so that the filter influence on the illumination angle distribution, e.g. for test purposes, can be totally eliminated.

Preferably a drive mechanism coupled with the rotatable filter element is provided. This allows automated presetting or resetting of an illumination angle distribution.

In the case of a preferred embodiment form, a control device acting together with the drive mechanism is provided which, depending on a preset illumination angle distribution of the projection light in the object plane, triggers the drive mechanism to engage a pre-set position of the filter element. Thus for example depending on available information the light source or the illumination optics of the filter can be automatically set or reset via the recticle structure or the actual setting.

At least one detector device acting together with the control device to record the intensity distribution of the projection light can be provided in a plane perpendicular to the optical axis. This allows the illumination angle distribution to be tracked by correspondingly following the moveable filter element depending on the intensity distribution detected.

The detector device can have a two-dimensional CCD array. Such a detector device has a high position resolution and is light-sensitive.

The detector device can be designed so that it calculates the illumination angle distribution of the projection light in the object plane. The directly measured illumination angle distribution is the ideal input quantity for re-adjustment with the aid of the moveable filter element.

INTRODUCTION TO THE DRAWINGS

DESCRIPTION OF THE EMBODIMENTS

Figure 1:
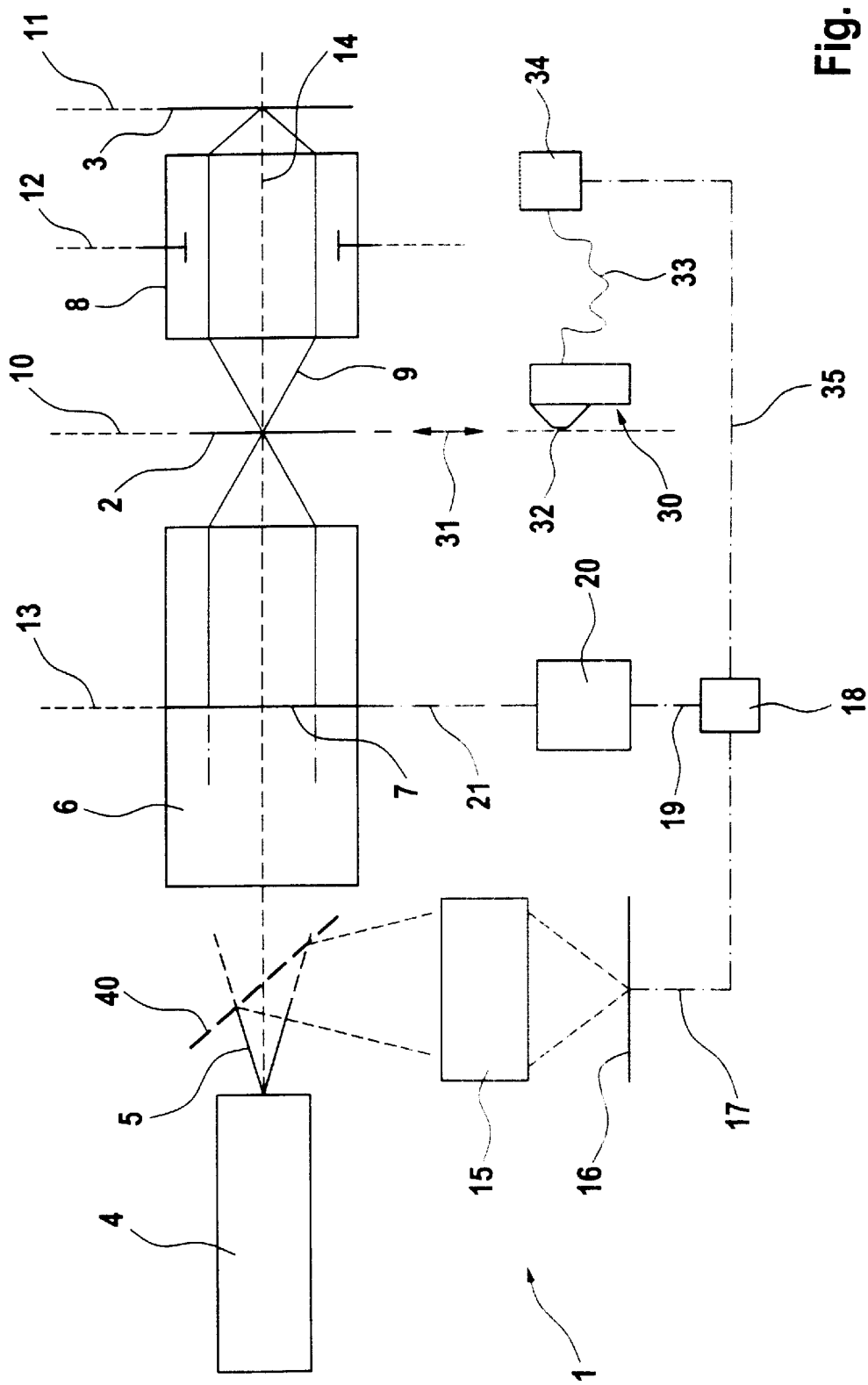
FIG. 1 is a diagrammatical overview of a projection exposure device.

In FIG. 1 a complete projection exposure device shown with the reference 1 for micro-lithography is illustrated. Using this a structure on a recticle 2 can be transferred onto the surface of a wafer 3.

A UV laser 4, for example an ArF excimer laser with a wavelength of 193.3 nm serves as the light source for the projection exposure device 1. A projection light bundle 5 emitted by the UV laser 4 first enters illumination optics 6. The ray path of the projection light bundle 5 is only indicated for the sake of clarity between the UV laser 4 and the illumination optics 6. The illumination optics 6 is for the most part shown diagrammatically in FIG. 1 as a block and can have a series of optical sub-assemblies, for example a zoom-lens, diffractive optical elements and a glass rod to homogenise the projection light bundle 5.

In its journey through the illumination optics 6 the projection light bundle 5 passes a pupil filter 7 positioned in a pupil plane 13, which is still to be described in detail. The pupil plane 13 is also a designated filter plane below. Then the projection light bundle 5 illuminates the recticle 2. The structures of the recticle 2 are projected with the aid of projection optics 8 onto the surface of the wafer 3. The projection optics 8 can be constructed from a number of lenses and/or mirrors.

A selected image light bundle passing a central object point on the recticle 2 and guided with the projection optics 8 is shown in FIG. 1 with the reference 9 and to make the image ray path clear it is extended a little further in the opposite direction, in other words in the direction of and into the illumination optics 6. The recticle 2 lies in the object plane 10 of the projection optics 8, which is indicated in FIG. 1 by a broken line. The wafer 3 lies in an image plane 11 of the projection optics 8, likewise indicated by a broken line. A pupil plane 12 of the projection optics 8 is likewise diagrammatically indicated in FIG. 1. It is conjugated to the filter plane 13 in the illumination optics 6.

The optical axis of the projection exposure device is likewise indicated as a broken line in FIG. 1 and given the reference 14.

A partly permeable optical plate 40 is placed in the ray path between the UV laser 4 and the illumination optics 6, which reflects a small amount of the projection light bundle 5 and the greater majority, in practice more than 99%, of this light bundle is transmitted. The ray path of the projection light bundle 5 passing through the optical plate 40, since here it is no longer of interest, is only continued a little further with a broken line.

The reflected amount, likewise illustrated as a broken line, of the projection light bundle 5 after the optical plate 40 is mapped by means of image optics 15 onto a two-dimensional CCD array 16. The latter communicates via a signal line 17, illustrated as a broken and dotted line, with a control device 18. The control device 18 triggers via a signal line 19, likewise illustrated as a broken and dotted line, a drive mechanism 20, which causes via a drive connection 21, likewise illustrated as a broken and dotted line, an element of the pupil filter 7 to turn around the optical axis 14, as still to be described.

A detector device 30 which can be used alternatively or in addition to the CCD array 16 to measure the illumination intensity and the illumination angle distribution of the image bundle 9 in the object plane 10 is shown in FIG. 1 in an inactive position outside the projection ray path. By means of a drive mechanism, not illustrated, the detector device 30 perpendicular to the optical axis 14, as illustrated by the double arrow 31, after removing the recticle 2, can be pushed into the ray path in such a way that an inlet opening 32 lies in the object plane 10, as a result of which an image bundle, e.g. the image bundle 9 normally illuminating the recticle, can enter inside the detector device 30.

The detector device 30 is connected via a flexible signal line 33 with a detection control device 34, which in turn communicates via a signal line 35, illustrated by a broken and dotted line, with the control device 18.

Figure 2:
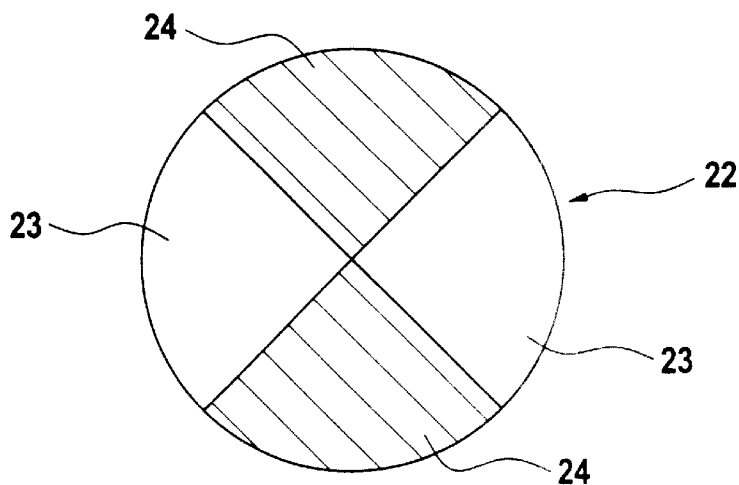
FIGS. 2–4 are embodiment examples of filter elements of a filter according to the invention for the projection exposure device of FIG. 1;.

The construction of a first embodiment example of a pupil filter is described below by way of FIGS. 2, 5 and 6:

The pupil filter 7 has two similarly constructed filter elements 22, 22' as illustrated in FIG. 2. The view there shows that the filter element 22 is subdivided into 4 quadrants. The transmission factor of the filter element 22 is constant within each quadrant. The transmission factors of the individual quadrants alternate in the circumferential direction in such a way that the transmission factors of opposite-lying quadrants are equal. Two quadrants lying opposite each other allow all the projection light through and in FIG. 2 are shown with the reference 23. They are designated "transmission quadrants" below. The two other quadrants only allow some of the projection light through, for example up to 50% and are shaded in FIG. 2 and shown with the reference 24. They are designated as "absorption quadrants" below. Instead of absorbing quadrants or zones, partially reflecting areas can also be provided where no total transmission is desired.

Figure 5:
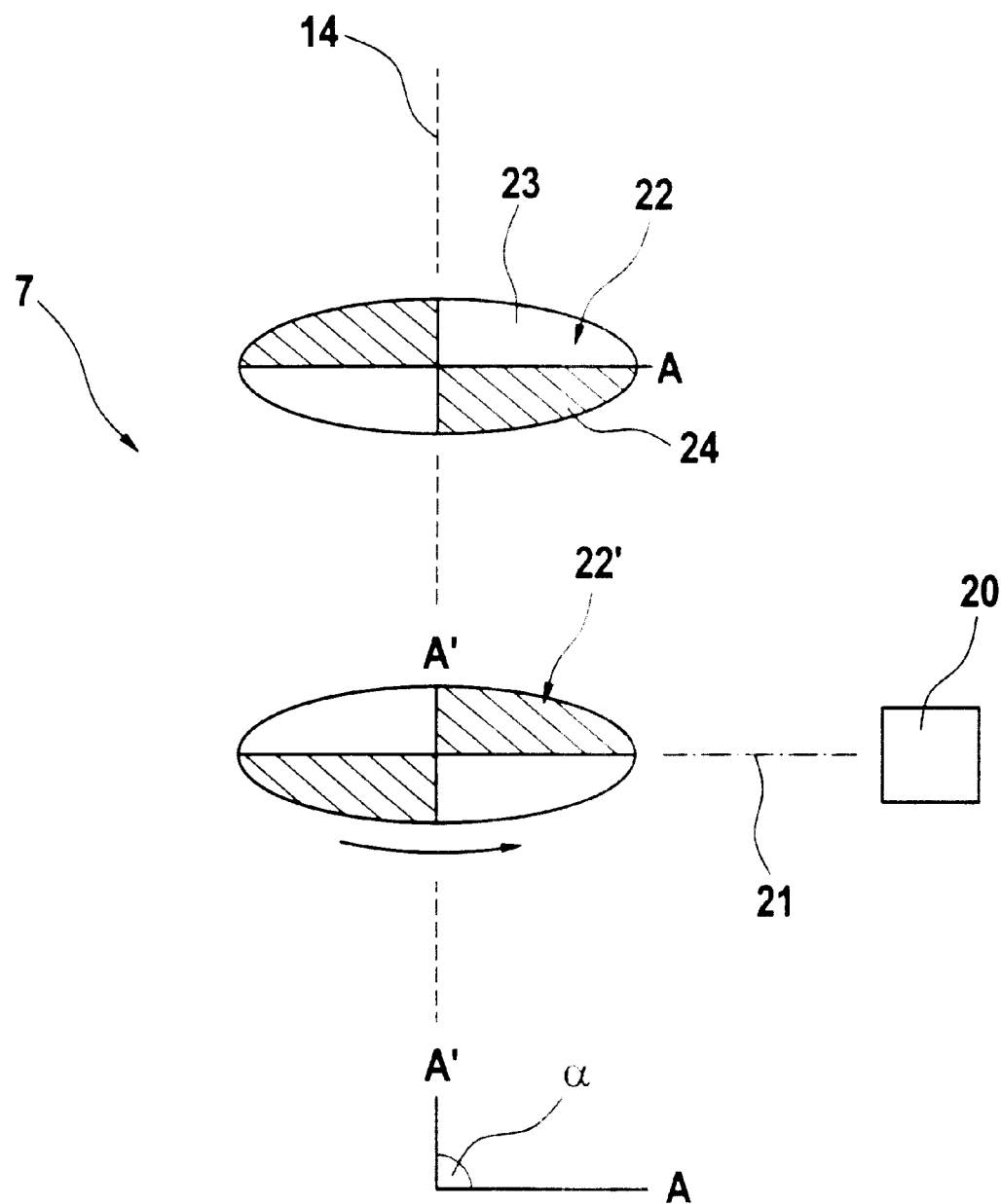
FIG. 5 is a diagrammatical illustration of a filter with a stationary and a rotatable filter element according to FIG. 2.

The diagrammatic illustration of FIG. 5 clarifies the design of the pupil filter 7. The two filter elements 22 are parallel and adjacent to each other so that the optical axis 14 passes through the centre of the two filter elements 22. The upper filter element 22 in FIG. 5 is stationary, while the lower filter element which has the reference 22' can be turned around the optical axis 14 by means of the drive mechanism 20.

A dividing line between the transmission quadrants 23 and the absorption quadrants 24 of the stationary filter elements 23 is marked with the letter A for descriptive purposes. The rotatable filter element 22' in FIG. 5 is turned opposite the stationary filter element 22 in such a way that the the dividing line A of the stationary filter element 22 corresponding to dividing line A' on the rotatable filter element 22' is turned anti-clockwise by 90°. In FIG. 5 below this turning angle which is described in the following as relative angle α, is once again shown diagrammatically with the markings A, A' of the dividing lines corresponding to each other.

As an alternative to turning around the optical axis, translation of a moveable filter element can also be provided in the filter plane.

Figure 6:
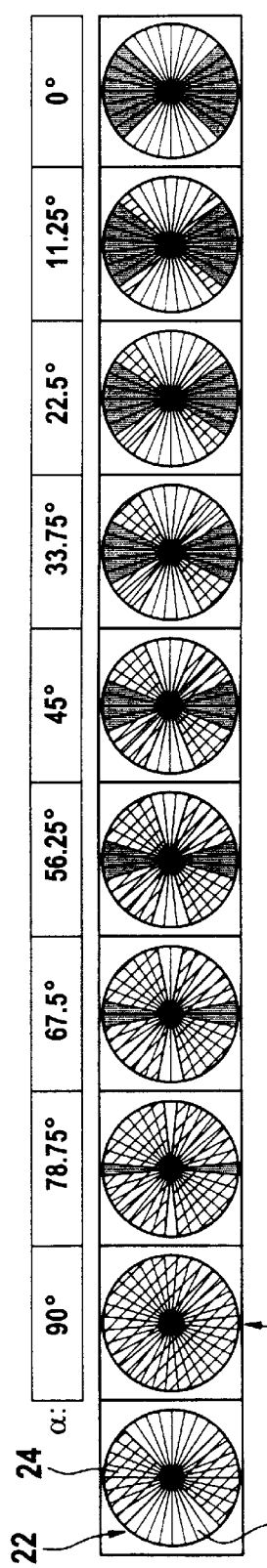
FIGS. 6 to 8 are embodiment examples of filters with two filter elements which can be rotated against each other viewed from the top in different relative angle-positions.

In FIG. 6, the filter elements 22, 22' lying above each other of the pupil filter 7 are shown in various relative angle positions. Well on the left in FIG. 6 the individual filter element 22 is once again illustrated for the sake of clarity. Sub-division of the filter elements into a total of 32 sectors also shown in the further individual illustrations of FIGS. 7 and 8 only serves to represent the total absorption changes of the particular pupil filter with a change of the relative angle and has no physical connection with the filter elements.

The relative angle position with a relative angle α of 90° already illustrated in FIG. 5 is shown on the left of FIG. 6 in the second individual illustration. The total transmission of the pupil filter 7 is constant over the entire filter face and corresponds to the transmission factor of an absorption quadrant 24.

In the sequence of individual illustrations which follow the individual illustration corresponding to the relative angle 90° it is shown how the total transmission factor changes over the filter face of the pupil filter 7 whenever the rotatable filter element 22' opposite the stationary filter element 22 is turned back from the position with relative angle α=90° in stages of 11.25° into the position α=0°.

In the case of the relative angle position 78, 75°, the two absorption quadrants 24 and, staggered by 90° the two transmission quadrants 23 overlap in a sector-shaped zone which corresponds to one eighth of a quadrant of a filter element 22. Where the absorption quadrants 24 overlap, the total absorption of the pupil filter 7 is twice as much as the absorption of an absorption quadrant 24 of a filter element 22 alone.

Where the two transmission quadrants 23 overlap, on the other hand all the projection light is allowed through. In the remaining area of the filter face the pupil filter 7 has the transmission of the absorption quadrant 24 of a filter element 22.

As evident from the further sequence of individual illustrations in FIG. 6, when turning back the rotatable filter element 22' opposite the stationary filter element 22 further, the sector-shaped zones, in which the total absorption is double, expand i.e. all the projection light passes through. At the same time the sector-shaped zones, in which total transmission of the pupil filter 7 takes place, which corresponds to the transmission of an absorption quadrant 24, become smaller.

Finally in the case of the relative angle 0° the situation is that the two filter elements 22, 22' lie over each other completely. Consequently this results in a transmission distribution of the pupil filter 7 over the filter face which corresponds to that of an individual filter element 22, whereby however the total absorption of the pupil filter 7 in the area of the absorption quadrant 24 is double, since there two absorption quadrants 24 lie behind each other in the ray path.

Further embodiment examples of pupil filters are described below by way of FIGS. 7 and 8. Components, which correspond to those which have already been explained in connection with embodiment examples described earlier, are shown with references increased by 100 and are not further discussed in detail.

Figure 7:
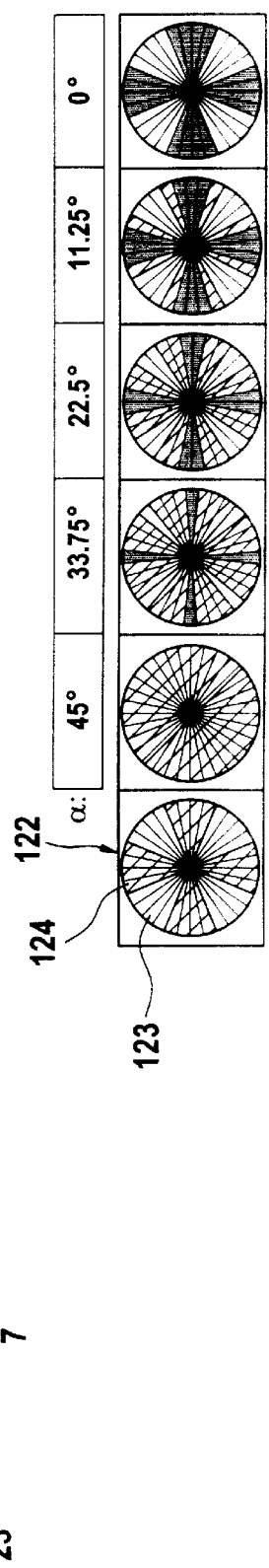

The filter element 122, which is shown in the left individual illustration of FIG. 7, is subdivided into a total of eight sector-shaped zones which in each case have a constant transmission factor over their zone area, whereby the transmission factor of zones bordering each other alternate in the circumferential direction. In this case each time an absorption zone 124 follows in the circumferential direction a transmission zone 123 and vice versa.

In the further individual illustrations of FIG. 7 the total transmissions of a pupil filter 107 are illustrated in various relative angle positions which, similar to the pupil filter 7 illustrated in FIG. 5, has two filter elements 122 arranged axially over each other. One of the two filter elements 122 can be turned opposite the other which is stationary. The second individual illustration on the left of FIG. 7 shows the situation, in which the two filter elements 122 are turned against each other by a relative angle of 45°. In this case all absorption zones 124 of the one filter element lie precisely behind or in front of transmission zones 123 of the other filter element 122, so that overall a homogeneous transmission progression with a constant total transmission factor over this face results, similar to the individual illustration in FIG. 6 with the relative angle 90°.

In the further individual illustrations of FIG. 7 a sequence is illustrated which step by step shows the turning back of the rotatable filter element in stages of 11.25° from the position α=45° into the position α=0°. In this case, at the first turning back stage (α=33.75°) a cross-shaped structure arises from four sector-shaped zones, in each case staggered by 90° against each other with sector angle 11.25°, in which the double absorption of the individual absorption zone 124 of a filter element 122 occurs and, staggered by 45° to this, a likewise cross-shaped structure from sector-shaped zones with the same sector angle, in which no absorption takes place. In the remaining areas there is total filter transmission which corresponds to the transmission of an individual absorption zone 124. With further turning back of the rotatable filter element the double absorbing zones expand and also the zones allowing all the projection light through with a progressive turning angle, up to α=0° again the situation occurs in which the transmission progression of the pupil filter 107 corresponds to that of a single filter element 122. However in this case absorption in the absorbing zones is twice as much as that of an individual absorption zone 124.

Figure 8:
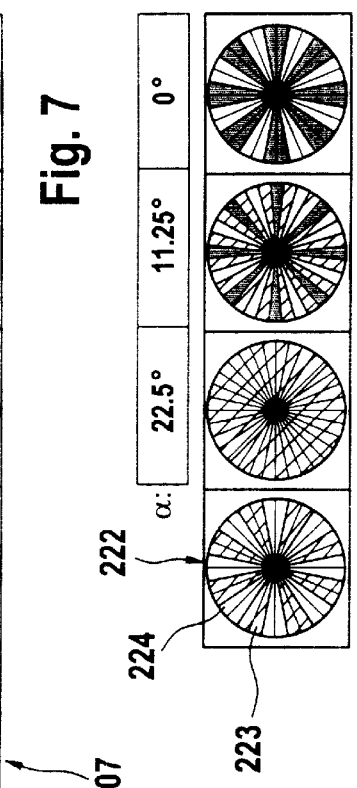

Similar to FIGS. 6 and 7, FIG. 8 shows the conditions in the case of a further pupil filter 207. This has two filter elements 222 as shown in the left individual illustration of FIG. 8.

A filter element 222 has a total of 16 sector-shaped zones 223, 224 in each case enclosing a circumferential angle of 22.5°. Each time a transmission zone 223 in this case follows an absorption zone 224 in the circumferential direction and vice versa. Here by turning the rotatable filter element by a relative angle a of 22.5° again the situation of a constant transmission progression over the total filter face can be produced (compare FIG. 8, second individual illustration on the left). If the rotatable filter element is turned back by stages of 11.25° in each case, which is also shown in FIG. 8 in individual illustrations, an eight figure structure of total absorption zones with possibly graduated absorption coefficients with an intermediate eight figure structure of total transmission zones can be produced here.

Figure 3:
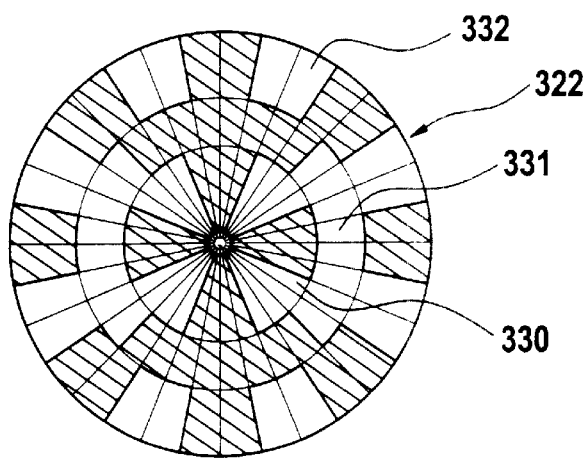
Figure 4:
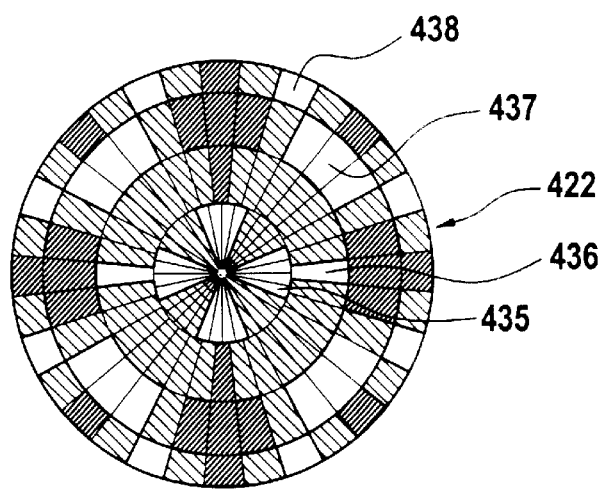

FIGS. 3 and 4 show further embodiment examples of filter elements:

Also in FIGS. 3 and 4 the filter elements are subdivided into 32 sectors in each case for descriptive purposes which, where equal transmission prevails on both sides of a sector border, have no physical connection.

The filter element 322 which is shown in FIG. 3 has a total of three concentric sections 330, 331 as well as 332 which are in each case subdivided into circumferential zones with alternating transmissions:

The innermost circumferential section has a transmission progression which in the circumferential direction corresponds to that of the filter element 122 of FIG. 7. The middle section 331 has in the circumferential direction a transmission progression which corresponds to that of the filter element 22 in FIGS. 2 and 6. The outermost section 332 again has a transmission progression which corresponds to that of the filter element 222 in FIG. 8.

The filter element 422 which is illustrated in FIG. 4 has a total of four concentric sections 435, 436, 437, 438 which in the circumferential direction posess various sequences of zones with different transmission factors.

The innermost section 435 in this case has a transmission progression which corresponds to that of the filter element 122 of FIG. 7.

The adjacent section 436 enclosing it is in the circumferential direction subdivided into zones with three different transmission factors. In this case all the projection light is allowed through in two zones which lie opposite each other and enclose a circumferential angle of 11.25° while two zones staggered opposite these by 90°, likewise enclosing a circumferential angle of 11.25°, have an absorption coefficient which is twice as much as the absorption coefficient of the remaining zone of the section 436.

The section 437 which is adjacent to the section 436 and surrounds this concentrically is likewise subdivided into zones with three different transmission factors. In this case in the circumferential direction of a zone which encloses a circumferential angle of 33.75° and has a double absorption coefficient there follows a zone which encloses a circumferential angle of 11.25° and which has a single absorption coefficient. This is joined by a zone which encloses a circumferential angle of 33.75° and allows all projection light to pass through completely. This is again followed in the circumferential direction by a zone which encloses a circumferential angle of 11.25° and has a single absorption coefficient. This sequence is repeated overall four times over the circumference of the section 437.

The outermost suction 438 finally has three different absorption coefficients. Here in each case zones which enclose a circumferential angle of 11.25° in the sequence "double absorption coefficient, single absorption coefficient, no absorption, single absorption coefficient" follow each other overall eight times.

The filter elements 22 to 422 can be combined with each other as desired. Naturally more than two filter elements 22 to 422 can also be staggered behind each other in the axial direction. Also the method of subdivision of the filter face into individual transmission and absorption zones and sections is not limited by the embodiment examples illustrated. In just the same way the number of the various absorption factors per filter element is not limited to three but can be considerably greater. Finally filter elements with non-staged transmission progressions can also be used.

Mathematically the transmission factor of a filter with circular filter elements in general form can be described in the following way:

In this case the filter consists of n filter elements lying behind each other which in each case have m circumferential sections. The transmission progression t of a point within a circumferential section of such a filter element can be written as:

$$t_{ij}(r,\beta)$$

Where:
- i is the index for the circumferential sections which go from 1 to m;
- j is the index for the filter elements which go from 1 to n;
- r is the distance of the point from the filter axis; and
- β is the polar angle of the point, measured from a fixed reference axis (e.g. dividing line A in FIG. 5).

The total transmission T of a circumferential section of the filter can then be described as a product of the transmission factors of the individual filter elements:

$$T_i(r,\beta) = \pi t_{ij}(r,\beta + \alpha_{ij})$$
$$j=1$$

The circumferential sections $t_{ij}$ of the filter elements are in this case turned by the angles $\beta_{ij}$ (i=1 ... m, j=1 ... n) around the exit position.

If there is no radial dependency of the transmission in the individual filter zones $t_{ij}$, it can be written more simply: $t_{ij}(r,\beta) = t_{ij}(\beta)$.

In the case of continuous transmission progression, the illustrations described here are constantly in r and β. Alternatively the transmission progressions can however also be discrete or step-shaped as described above in conjunction with the figures.

The projection exposure device 1 functions in the following way:

Depending on the type of the object structure to be projected with the projection exposure device 1, the appearance of the intensity profile of the projection light bundle 5 in the pupil plane 13 is pre-set.

The desired intensity profile of the projection light bundle 5 in the pupil plane 13 can for example be a constant intensity progression over the bundle profile. Depending on the structure to be mapped however any other desired intensity distributions of the projection light bundle 5 in the pupil plane 13, so-called illumination settings, can also be preset. For certain structures, for example an annular illumination, i.e. an illumination type, in regard to which the intensity distribution in the pupil plane 13 in a circular area around the optical axis 14 has the greatest intensity. Depending on the symmetry of the structure on the recticle 2 other illumination settings can also be set for optimum projection, for example with multiple symmetry in the circumferential direction according to the absorption progressions which are shown in the individual illustrations of FIGS. 6 to 8.

An ideal transmission progression for the pupil filter 7 is calculated from the intensity profile of the projection light bundle 5 in front of the illumination optics 6 measured with the aid of the CCD array 16 and ideal values for the illumination angle distribution and the illumination intensity in the object plane 10. Alternatively or in addition to this calculation which is performed in a processor, not illustrated, of the control device 18, the measurement data of the detector device 30 are used for the illumination intensity- or illumination angle distribution in the object plane 10.

The drive mechanism is triggered via the control device 18 so that the desired transmission progression is set by turning the rotatable filter element 22'. Finally the projection can be exposed.

What is claimed is:

1. Projection exposure device for producing in an image plane an image of an object positioned in an object plane comprising:
    a light source emitting projection light,
    illumination optics positioned in a ray path between the light source and the object plane and
    projection optics positioned in a ray path between the object plane and the image plane,
    a filter having at least one filter element moveable in a filter plane positioned between the light source and the object plane, and, in the vicinity of a pupil plane, wherein the filter has at least a first and a second pre-set position, and the filter element is moveable between the at least first and second pre-set positions between consecutive exposures and after changing a reticle, wherein the filter element is static during exposure;
    wherein the at least one filter element includes a transmission factor distributed thereover in such a way that the intensity distribution of the projection light perpendicular to an optical axis of the ray path away from the at least one filter element and toward the object plane changes with the movement of the at least one filter element in the filter plane, and,
    wherein a portion of the at least one filter element having a transmission factor which is greater than 0 and less than 100%.

2. The device according to claim 1, wherein the at least one filter element is rotatably positionable about the optical axis, and wherein the transmission factor is not rotationally symmetrical about the filter element.

3. The device according to claim 1, wherein the at least one filter element includes a transmission factor which varies radially from the optical axis.

4. The device according to claim 1, wherein the at least one filter element comprises a continuous graduated filter.

5. The device according to claim 1, wherein the at least one filter element includes a plurality of zones each having varying transmission factors.

6. The device according to claim 5, wherein the illumination optics is provided with a circular aperture in the filter plane and each of the plurality of zones of the at least one filter element include a transmission factor which varies in a circumferential direction.

7. The device according to claim 5, wherein each of the plurality of zones of the at least one filter element include a transmission factor which varies in a radial direction.

8. The device according to claim 5, wherein the plurality of zones comprises four quadrant zones, and wherein the transmission factor alternates in the circumferential direction.

9. The device according to claim 2, wherein the at least one filter element comprises two filter elements, the two filter elements positioned relative to each other so as to be rotatable relative to each other.

10. The device according to claim 9, wherein a rotational-symmetrical transmission factor results in a relative position of the filter elements.

11. The device according to claim 2, further comprising a drive mechanism coupled to the at least one filter element, to, in turn, facilitate rotation of the at least one filter element.

12. The device according to claim 11, further comprising a control device associated with the drive mechanism, the control device capable of controlling the drive mechanism to position the filter element in a desired orientation according to a given illumination angle distribution.

13. The device according to claim 12, further comprising at least one detector device positioned in a plane perpendicular to the optical axis and associated with the control device, to, in turn, record the intensity distribution of the projection light in the object plane.

14. The device according to claim 13, wherein the at least one detector device comprising a two-dimensional CCD array.

15. The device according to claim 13 wherein the at least one detector device comprises means for identifying the illumination angle distribution of the projection light in the object plane.

16. Projection exposure device for producing in an image plane an image of an object positioned in an object plane comprising:
    a light source emitting projection light,
    illumination optics positioned in a ray path between the light source and the object plane and
    projection optics positioned in a ray path between the object plane and the image plane; and
    a filter having at least one filter element moveable in a filter plane positioned between the light source and the object plane, and, in the vicinity of a pupil plane, wherein the filter has at least a first and a second pre-set position, and the filter element is moveable between the at least first and second pre-set positions between consecutive exposures and after changing a reticle, wherein the filter element is static during exposure;

wherein the at least one filter element includes a transmission factor distributed thereover in such a way that the intensity distribution of the projection light perpendicular to an optical axis of the ray path away from the at least one filter element and toward the object plane changes with the movement of the at least one filter element in the filter plane, wherein a portion of the at least one filter element having a transmission factor which is greater than 0 and less than 100%, and, wherein the at least one filter element is rotatably positionable about the optical axis, and wherein the transmission factor is not rotationally symmetrical about the filter element.

17. Projection exposure device for producing in an image plane an image of an object positioned in an object plane comprising:

a light source emitting projection light, illumination optics positioned in a ray path between the light source and the object plane and projection optics positioned in a ray path between the object plane and the image plane; and a filter having at least two filter elements each moveable in a filter plane positioned between the light source and the object plane, and, in the vicinity of a pupil plane, wherein the filter has at least a first and a second pre-set position, and the filter element is moveable between the at least first and second pre-set positions between consecutive exposures and after changing a reticle, wherein the filter element is static during exposure;

wherein the at least two filter elements include a transmission factor distributed thereover in such a way that the intensity distribution of the projection light perpendicular to an optical axis of the ray path away from the at least two filter elements and toward the object plane changes with the movement of the at least two filter elements in the filter plane, wherein the at least two filter elements are rotatably positionable relative to each other about the optical axis, and wherein the transmission factor is not rotationally symmetrical about the at least two filter elements, and, wherein a portion of the at least two filter elements having a transmission factor which is greater than 0 and less than 100%.

18. A filter device for use in association with a projection exposure device, the projection exposure device being of the type for producing in an image plane an image of an object positioned in an object plane and including a light source emitting projection light, illumination optics positioned in a ray path between the light source and the object plane, and projection optics positioned in a ray path between the object plane and the image plane, the filter device comprising:

at least one filter element moveable in a filter plane which is positioned between the light source and the object plane, and, in the vicinity of a pupil plane, wherein the filter has at least a first and a second pre-set position, and the filter element is moveable between the at least first and second pre-set positions between consecutive exposures and after changing a reticle, wherein the filter element is static during exposure;

wherein the at least one filter element includes a transmission factor distributed thereover in such a way that the intensity distribution of the projection light perpendicular to an optical axis of the ray path away from the at least one filter element and toward the object plane changes with the movement of the at least one filter element in the filter plane, and, wherein a portion of the at least one filter element having a transmission factor which is greater than 0 and less than 100%.

* * * * *